(12) United States Patent
Lin et al.

(10) Patent No.: US 12,402,372 B2
(45) Date of Patent: Aug. 26, 2025

(54) INSULATING STRUCTURES IN SEMICONDUCTOR DEVICE

(71) Applicant: Taiwan Semiconductor Manufacturing Company, Ltd., Hsinchu (TW)

(72) Inventors: Tzu-Ging Lin, Kaohsiung (TW); Chen-Yu Tai, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 17/832,495

(22) Filed: Jun. 3, 2022

(65) Prior Publication Data

US 2023/0395654 A1 Dec. 7, 2023

(51) Int. Cl.
| | | |
|---|---|---|
| *H10D 30/67* | (2025.01) | |
| *H01L 21/762* | (2006.01) | |
| *H10D 30/01* | (2025.01) | |
| *H10D 62/10* | (2025.01) | |
| *H10D 64/01* | (2025.01) | |

(52) U.S. Cl.
CPC ..... *H10D 62/115* (2025.01); *H01L 21/76224* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01)

(58) Field of Classification Search
CPC ........... H01L 29/0649; H01L 21/76224; H01L 29/0665; H01L 29/47392; H01L 29/66545; H01L 29/66742; H01L 29/78618; H01L 29/78696

USPC .......................................................... 257/347
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

FOREIGN PATENT DOCUMENTS

| | | | | |
|---|---|---|---|---|
| CN | 107706200 A | * | 2/2018 | ....... H01L 27/14605 |
| CN | 113808947 A | * | 12/2021 | ......... H01L 29/1037 |

*Primary Examiner* — Phuc T Dang
(74) *Attorney, Agent, or Firm* — Sterne, Kessler, Goldstein & Fox P.L.L.C.

(57) ABSTRACT

The present disclosure describes a structure that provides insulation in a semiconductor device and a method for forming the structure. The structure includes a first isolation structure including a first isolation layer disposed on a substrate, a second isolation layer disposed on the first isolation layer, and a first high-k dielectric layer having a first height and disposed on the second isolation layer. The structure further includes a second isolation structure including a third isolation layer disposed on the substrate, a fourth isolation layer disposed on the third isolation layer, and a second high-k dielectric layer having a second height and disposed on the fourth isolation layer, where the second height is less than the first height. The structure further includes a gate structure disposed on the first isolation structure, and an insulating structure disposed adjacent to the gate structure and on the second isolation structure.

20 Claims, 21 Drawing Sheets

(56) References Cited

U.S. PATENT DOCUMENTS

| | | |
|---|---|---|
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2012/0001259 A1* | 1/2012 | Chuang ........... H01L 21/823462 257/330 |

* cited by examiner

INSULATING STRUCTURES IN SEMICONDUCTOR DEVICE

BACKGROUND

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around field-effect transistors (GAAFETs) and fin field-effect transistors (finFETs).

BRIEF DESCRIPTION OF THE DRAWINGS

Aspects of the present disclosure are best understood from the following detailed description when read with the accompanying figures.

DETAILED DESCRIPTION

Figure 1:
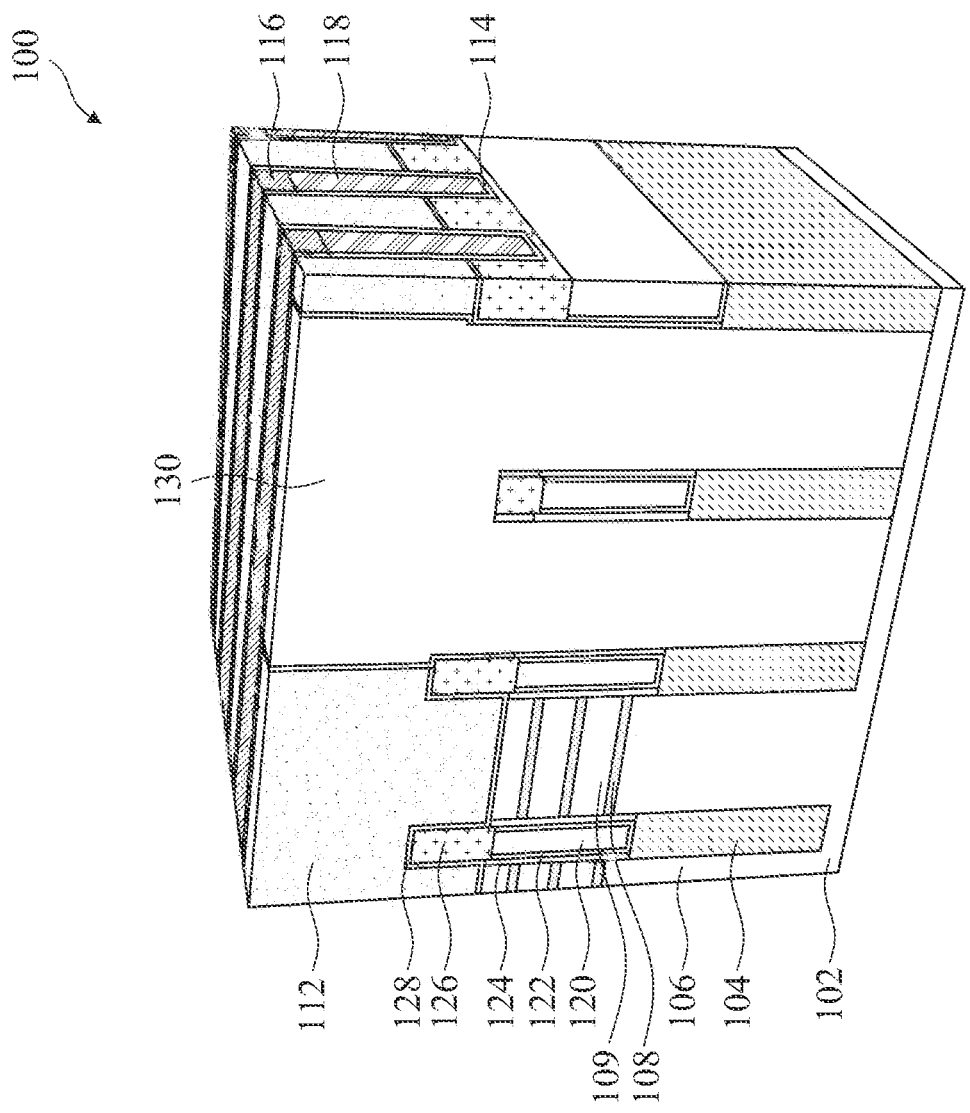
FIG. 1 illustrates an isometric view of a semiconductor device with an insulating structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1-6, 8-17, 18A, 18B, 19A, and 19B with the same annotations applies to each other, unless mentioned otherwise.

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around field-effect transistors (GAAFETs) and fin field-effect transistors (finFETs). In finFETs, fin structures can be formed on a substrate. In GAAFETs, fin structures can be formed on a substrate, nanostructured gate layers can be formed on the fin structures, and nanostructured channel layers can be formed on the nanostructured gate layers. In both finFETs and GAAFETs, source/drain (S/D) regions can be formed on a first portion of the fin structures and gate structures can be formed on a second portion of the fin structures.

Shallow trench isolation (STI) regions can be formed between adjacent fin structures. Isolation layers can be formed on the STI regions. High-k dielectric layers can be formed on the isolation layers. STI regions, isolation layers, and high-k dielectric layers can form isolation structures. The isolation structures can sectionalize the fin structures and prevent adjacent S/D regions from merging together, which can allow a higher density of transistors to be formed on the substrate. In some devices, insulating structures can be formed through portions of the gate structures. The insulating structures can sectionalize the gate structures, which can further allow a higher density of transistors to be formed on the substrate.

To form the insulating structures, insulating structure openings can be formed by an etch process through the gate structures and the fin structures. The insulating structure openings can extend beyond the depletion regions of the substrate and into the accumulation regions of the substrate. However, because of the shadowing effect of the high-k dielectric layers, the isolation layers, and the STI regions, and because of the plasma charge accumulated at the high-k dielectric layers and the isolation layers, portions of the fin structures and the substrate can remain adjacent to the STI regions. Portions of the fin structures and the substrate can be interposed between the insulating structures and the STI regions. These remaining portions of the fin structures and the substrate can increase the leakage current, which can decrease device reliability and performance.

The present disclosure provides example semiconductor devices with an insulating structure and an example method for fabricating the same. In some embodiments, when forming the insulating structure openings, portions of the high-k dielectric layers can be removed by an etch process. Portions of the STI regions can also be removed to form slanted sidewalls at the top portions of the STI regions. The reduced height of the high-k dielectric layers and the slanted sidewalls at the top portions of the STI regions can reduce the shadowing effect of the high-k dielectric layers and the STI regions and the plasma charging effect at the high-k dielectric layers. Therefore, an increased amount of fin structures and substrate adjacent to the STI regions can be removed after the insulating structure openings are formed. The insulating structures can be formed in the insulating structure openings. Because more of the fin structures and substrate are removed, leakage current can be reduced, which can improve device reliability and performance. In some embodiments, the leakage current can be reduced by an order between about $10^2$ and about $10^4$.

In some embodiments, when forming the insulating structure openings, the high-k dielectric layers can be removed by an etch process. Portions of the isolation layers can be removed. Portions of the STI regions can also be removed to form slanted sidewalls at the top portions of the STI regions. The reduced height of the isolation layers and the slanted sidewalls at the top portions of the STI regions can reduce the shadowing effect of the isolation layers and the STI regions and the plasma charging effect at the isolation layers. Therefore, an increased amount of fin structures and substrate adjacent to the STI regions can be removed after the insulating structure openings are formed. The insulating structures can be formed in the insulating structure openings. Because more of the fin structures and the substrate are removed, leakage current can be reduced, which can improve device reliability and performance. In some embodiments, the leakage current can be reduced by an order between about $10^2$ and about $10^4$.

Figure 3:
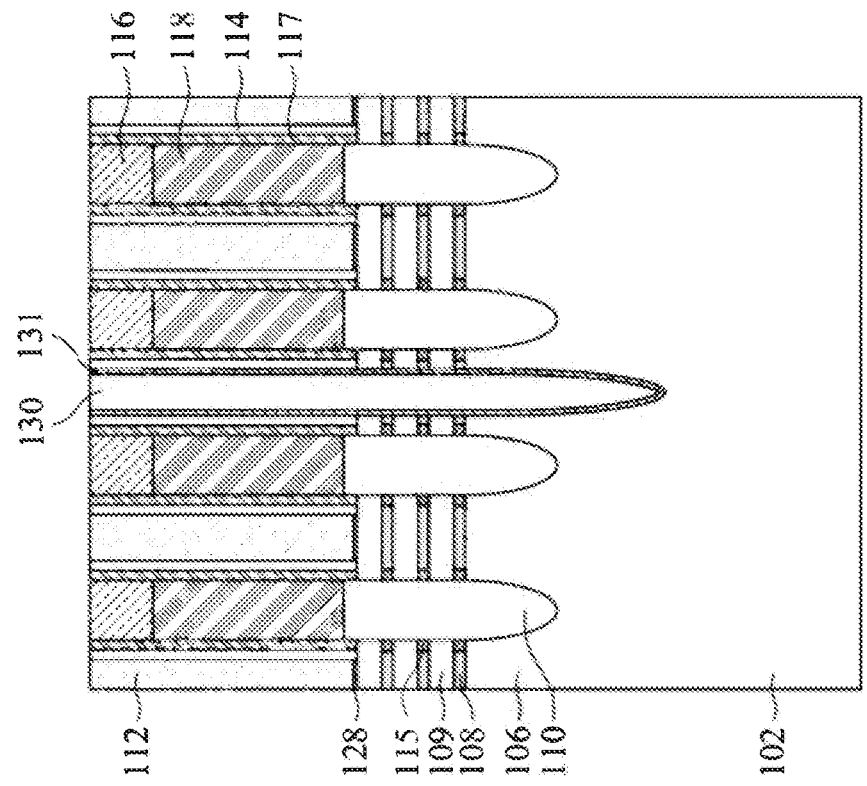
Figure 3:
Figure 4:
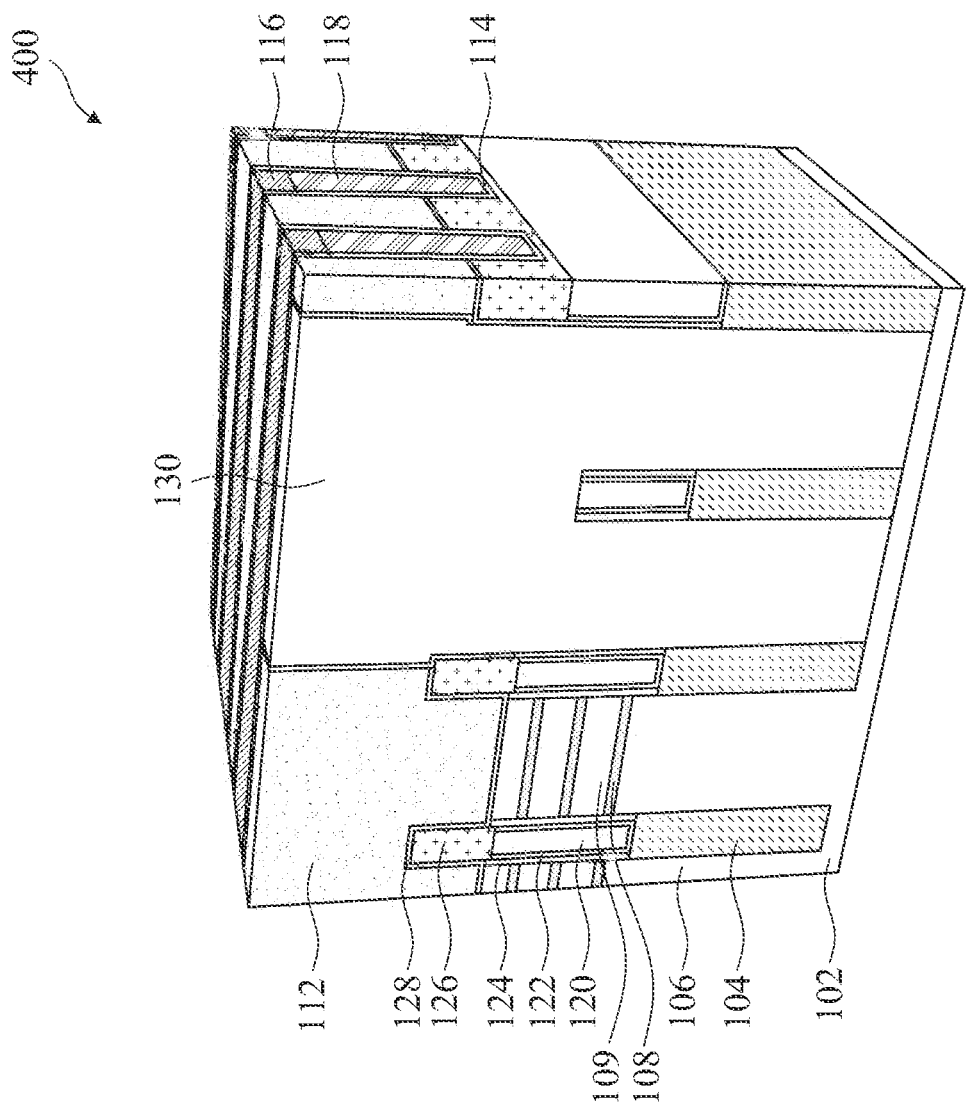
FIG. 4 illustrates an isometric view of another semiconductor device with an insulating structure, in accordance with some embodiments.

FIGS. 1 and 4 illustrate isometric views of semiconductor devices 100 and 400 with an insulating structure, respectively, according to some embodiments. Each semiconductor device of semiconductor devices 100 and 400 can include a substrate 102, STI regions 104, fin structures 106, nanostructured gate layers 108, nanostructured channel layers 109, isolation layers 120, isolation layer liners 122, cladding layers 124, high-k dielectric layers 126, oxide layers 128, gate structures 112, spacers 114, interlayer dielectric (ILD) layers 118, top etch stop layers (ESLs) 116, an insulating structure 130, side ESLs 117 (visible in FIG. 3), S/D regions 110 (visible in FIG. 3), inner spacers 115 (visible in FIG. 3), and an insulating structure liner 131 (visible in FIG. 3).

Referring to FIGS. 1-5, substrate 102 can be a semiconductor material, such as silicon (Si), germanium (Ge), silicon germanium (SiGe), a silicon-on-insulator (SW) structure, and combinations thereof. Further, substrate 102 can be doped with p-type dopants, such as boron (B), indium (In), aluminum (Al), and gallium (Ga), or n-type dopants, such as phosphorous (P) and arsenic (As).

Fin structures 106 and nanostructured channel layers 109 can be a semiconductor material. In some embodiments, fin structures 106 and nanostructured channel layers 109 can have the same semiconductor material as substrate 102. For example, fin structures 106 and nanostructured channel layers 109 can include Si. In some embodiments, fin structures 106 and nanostructured channel layers 109 can have the same crystalline orientation as that of substrate 102.

Gate structures 112 and nanostructured gate layers 108 can include a multi-layered structure (not shown in FIGS. 1-5). Gate structures 112 and nanostructured gate layers 108 can include gate dielectric layers (not shown in FIGS. 1-5). In some embodiments, gate dielectric layers can include an insulating material, such as silicon oxide ($SiO_x$), silicon nitride (SiN), silicon carbon nitride (SiCN), silicon oxycarbon nitride (SiOCN), germanium oxide ($GeO_x$), and silicon germanium oxide ($SiGeO_x$). In some embodiments, gate dielectric layers can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), lanthanum oxide ($La_2O_3$), and zirconium silicate ($ZrSiO_2$). The high-k dielectric material can have a dielectric constant that is greater than about 3.9. Gate dielectric layers can have a thickness between about 0.5 nm and about 10 nm.

Gate structures 112 and nanostructured gate layers 108 can include gate electrodes (not shown in FIGS. 1-5). In some embodiments, gate electrodes can include a conductive layer disposed on the gate dielectric layers. The conductive layer can have multiple layers (not shown in FIGS. 1-5). The conductive layer can include a work function metal (WFM) layer (not shown in FIGS. 1-5) disposed on the gate dielectric layers and a metal fill layer (not shown in FIGS. 1-5) disposed on the WFM layer. In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped titanium nitride (TiN), Al-doped tantalum (Ta), Al-doped tantalum nitride (TaN), other suitable Al-based materials, substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu) alloy, and combinations thereof. The metal fill layer can include a suitable conductive material, such as tungsten (W), low-fluorine tungsten (LFW), Ti, silver (Ag), ruthenium (Ru), molybdenum (Mo), copper (Cu), cobalt (Co), Al, iridium (Ir), nickel (Ni), metal alloys, and combinations thereof. The metal fill layer can have a thickness between about 2 nm and about 100 nm.

Referring to FIG. 3, S/D regions 110 can be a semiconductor material. In some embodiments, S/D regions 110 can have the same semiconductor material as substrate 102, fin structures 106, and nanostructured channel layers 109. For example, S/D regions 110 can include Si. In some embodiments, S/D regions 110 can be an epitaxial Si. In some embodiments, S/D regions 110 can have the same crystalline orientation as that of substrate 102, fin structures 106, and nanostructured channel layers 109. S/D regions 110 can be doped with p-type dopants, such as B and other suitable p-type dopants. S/D regions 110 can be doped with n-type dopants, such as P and other suitable n-type dopants. In some embodiments, S/D regions 110 can be doped with the same dopant as substrate 102. A dopant concentration of S/D regions 110 can be in a range from about $1 \times 10^{20}$ atoms/cm$^3$ to about $3 \times 10^{22}$ atoms/cm$^3$. In some embodiments, S/D regions 110 can have a higher dopant concentration than that of substrate 102. For example, S/D regions 110 can have a dopant concentration that is between about 10 times and about 100 times higher than that of substrate 102.

Referring to FIGS. 1, 2, 4, and 5, isolation layer liners 122 can include an insulating material. In some embodiments, isolation layer liners 122 can include SiCN. Cladding layers 124 can be a semiconductor material. In some embodiments, cladding layers 124 can include SiGe. Referring to FIGS. 1, 3, and 4, oxide layers 128 can include an oxide material. In some embodiments, oxide layers 128 can include $SiO_x$ and $SiGeO_x$. In some embodiments, oxide layers 128 can function as an interfacial oxide (IC)) layer between gate structures 112 and nanostructured channel layers 109. Spacers 114, ILD layers 118, and top ESLs 116 can include an insulating material, such as $SiO_x$, SiN, SiCN, SiOCN, and $SiGeO_x$. Referring to FIG. 3, inner spacers 115, side ESLs 117, and insulating structure liner 131 can include an insulating material, such as $SiO_x$, SiN, SiCN, SiOCN, and $SiGeO_x$.

Referring to FIGS. 1-5, insulating structure 130 can include an insulating material, such as $SiO_x$, SiN, SiCN, SiOCN, and $SiGeO_x$. A top surface of insulating structure 130 can be substantially coplanar with a top surface of gate structures 112. Referring to FIGS. 1, 2, 4, and 5, STI regions 104 and isolation layers 120 can include an insulating material, such as $SiO_x$, SiN, SiCN, SiOCN, and $SiGeO_x$. In some embodiments, STI regions 104 can include a STI liner (not shown in FIGS. 1, 2, 4, and 5) that can include an insulating material. High-k dielectric layers 126 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The high-k dielectric material can have a dielectric constant that is greater than about 3.9. STI regions 104, isolation layers 120, and high-k dielectric layers 126 can form isolation structures. The isolation structures can sectionalize fin structures 106. Insulating structure 130 can sectionalize gate structures 112.

Figure 2:
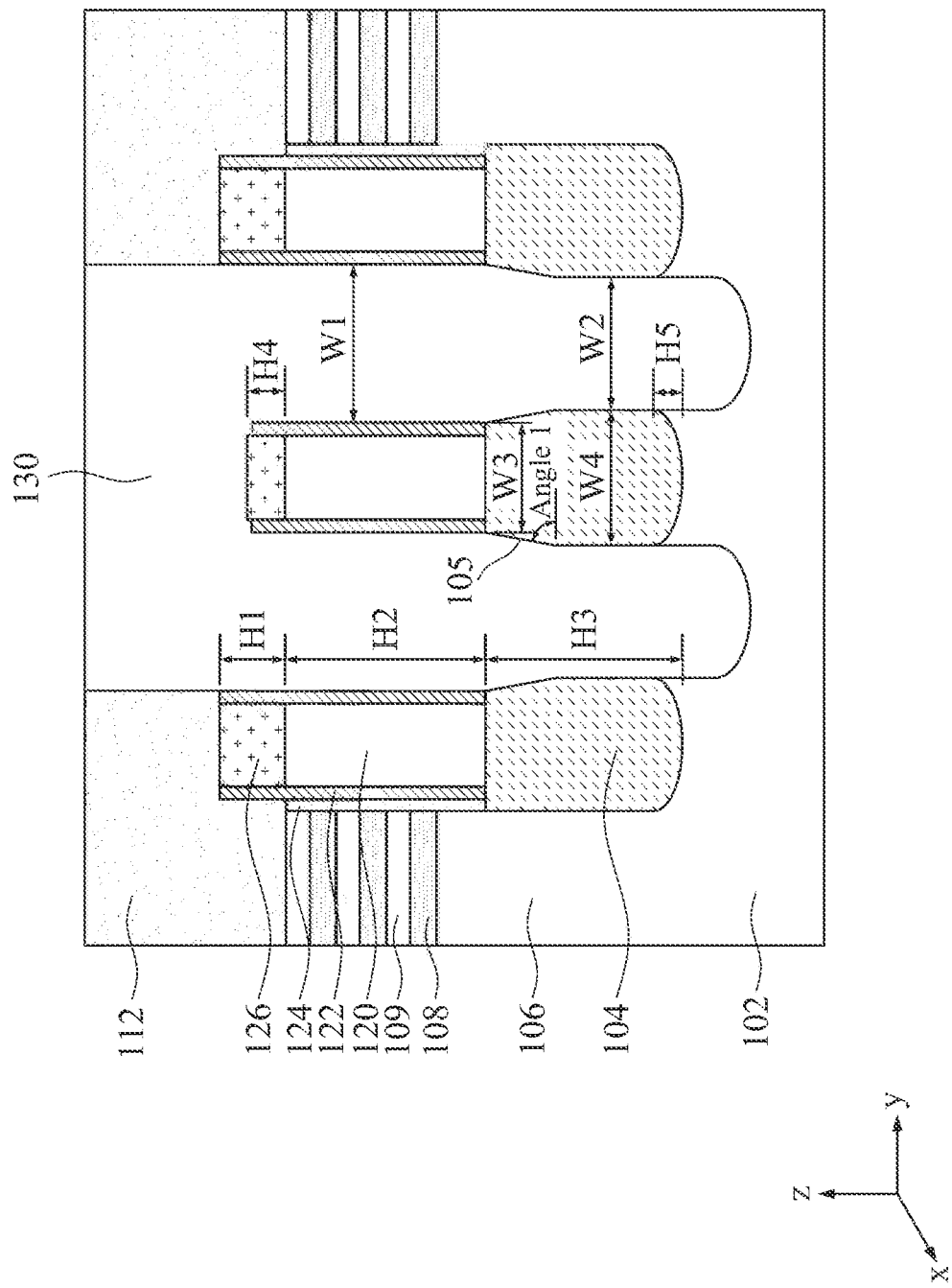
FIGS. 2 and 3 illustrate cross-sectional views of a semiconductor device with an insulating structure, in accordance with some embodiments.
Figure 5:
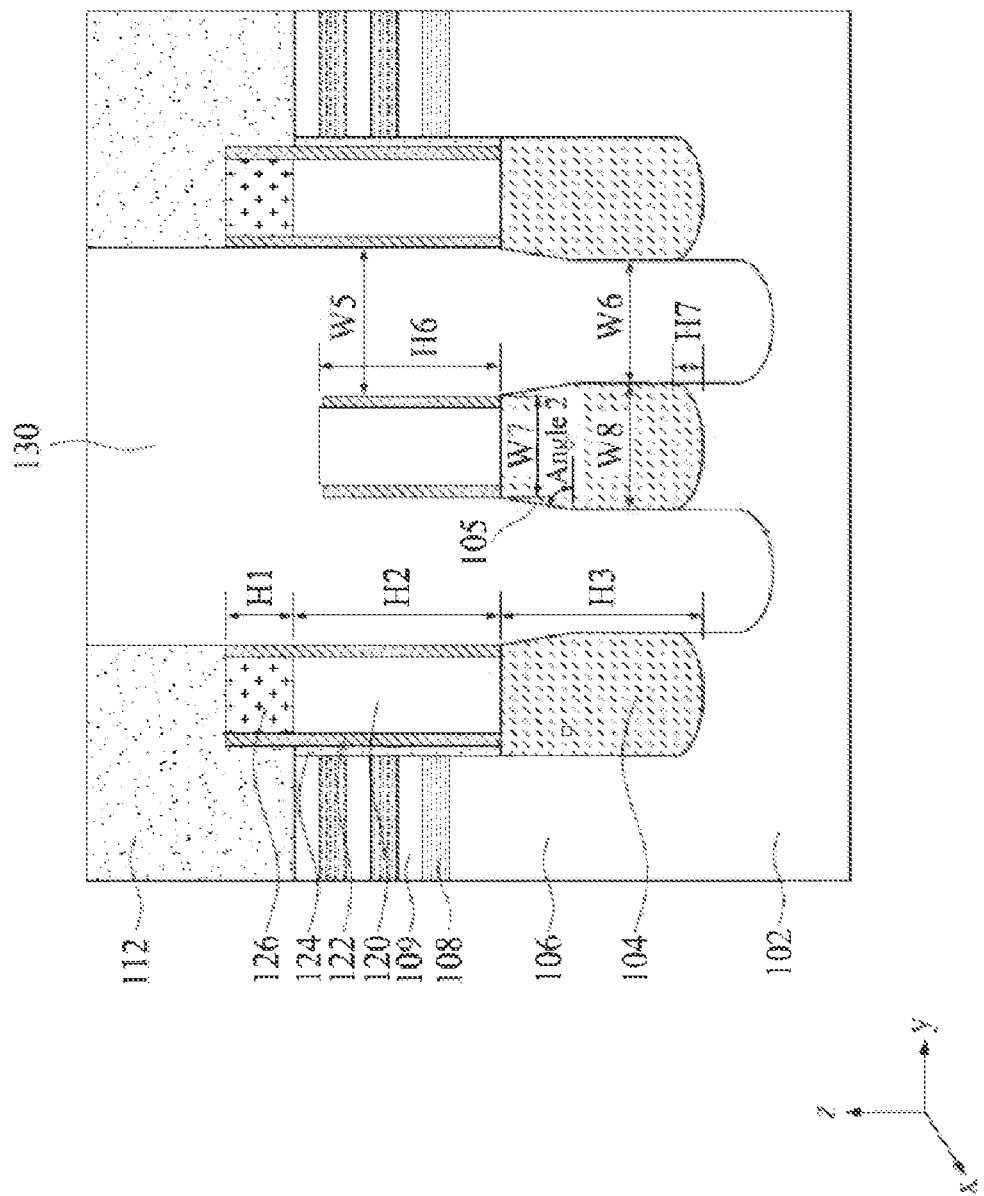
FIG. 5 illustrates a cross-sectional view of another semiconductor device with an insulating structure, in accordance with some embodiments.

Referring to FIGS. 2 and 5, high-k dielectric layers 126 can have a height H1 between about 10 nm and about 30 nm. Isolation layers 120 can have a height H2 between about nm and about 100 nm. STI regions 104 can have a height H3 between about 60 nm and about 100 nm. The sum H1+H2+H3 can be between about 130 nm and about 230 nm.

Referring to FIG. 2, high-k dielectric layers 126 with a reduced height can have a height H4 between about 5 nm and about 15 nm, between about 3 nm and about 20 nm, and between about 1 nm and about 25 nm. The ratio H1/H4 can be between about 2 and about 3, between about 1.8 and about 4, and between about 1.5 and about 5. If height H4 is greater than about 25 nm, or the ratio H1/H4 is less than about 1.5, the shadowing effect of high-k dielectric layers 126 when forming the insulating structure openings can be too great. Too much plasma charge can also accumulate at high-k dielectric layers 126 that can make it harder to remove fin structures 106 and substrate 102. The shadowing effect and the plasma charging effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If height H4 is less than about 1 nm, or the ratio H1/H4 is greater than about 5, the etching process to remove portions of high-k dielectric layers 126 can take too long and the size of insulating structure 130 can be too great.

The remaining portions of fin structures 106 and substrate 102 adjacent to STI regions 104 can have a height H5 between about 10 nm and about 13 nm, between about 8 nm and about 15 nm, and between about 5 nm and about 20 nm. Height H5 can be measured from a first position to a second position. The first position can be at a bottom surface of STI regions 104. The second position can be at a point where a lateral distance (e.g., in the y-direction) between a sidewall of insulating structure 130 and the adjacent STI region 104 is about 1.5 nm. The ratio H5/(H1+H2+H3) can be between about 0.06 and about 0.08, between about 0.05 and about 0.09, and between about 0.025 and about 0.1. If height H5 is greater than about 20 nm, or the ratio H5/(H1+H2+H3) is greater than about 0.1, the leakage current can be too great, which can decrease device reliability and performance. The leakage current can be too great if the leakage current density is greater than about $10^{-11}$ A/nm. If height H5 is less than about 5 nm, or the ratio H5/(H1+H2+H3) is less than about 0.025, the etching process to remove portions of fin structures 106 and substrate 102 adjacent to STI regions 104 can take too long and the size of insulating structure 130 can be too great.

Insulating structure 130 can have a width W1 adjacent to isolation layers 120 between about 16 nm and about 20 nm. Insulating structure 130 can have a width W2 adjacent to STI regions 104 between about 8 nm and about 14 nm. The ratio W1/W2 can be between about 1.8 and about 2, between about 1.5 and about 2.2, and between about 1.15 and about 2.5. If the ratio W1/W2 is greater than about 2.5, the shadowing effect of STI regions 104 when forming the insulating structure openings can be too great. The shadowing effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If the ratio W1/W2 is less than about 1.15, the etching process to remove portions of fin structures 106 and substrate 102 adjacent to STI regions 104 can take too long and the size of insulating structure 130 can be too great. A bottom surface of insulating structure 130 can be lower than a bottom surface of STI regions 104.

STI regions 104 can have a width W3 at the top portions of STI regions 104 between about 8 nm and about 10 nm. STI regions 104 can have a width W4 at the bottom portions of STI regions 104 between about 10 nm and about 12 nm. The ratio W3/W4 can be between about 0.75 and about 0.85, between about 0.7 and about 0.9, and between about 0.65 and about 0.95. If the ratio W3/W4 is greater than about 0.95, the shadowing effect of STI regions 104 when forming the insulating structure openings can be too great. The shadowing effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If the ratio W3/W4 is less than about 0.65, the etching process to remove the shoulders of STI regions 104 can take too long and the size of insulating structure 130 can be too great.

Top portions of STI regions 104 can have slanted sidewalls 105. An angle 1 between slanted sidewall 105 and a horizontal direction, such as the y-direction, can be between about 70° and about 75°, between about 65° and about 80°, and between about 60° and about °. If angle 1 is greater than about 85°, the shadowing effect of STI regions 104 when forming the insulating structure openings can be too great. The shadowing effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If angle 1 is less than about 60°, the etching process to remove the shoulders of STI regions 104 can take too long and the size of insulating structure 130 can be too great.

Referring to FIG. 5, isolation layers 120 with a reduced height can have a height H6 between about 50 nm and about 60 nm, between about 40 nm and about 70 nm, and between about 30 nm and about 80 nm. The ratio H2/H6 can be between about 1.4 and about 1.6, between about 1.3 and about 1.8, and between about 1.2 and about 2. If height H6 is greater than about 80 nm, or the ratio H2/H6 is less than about 1.2, the shadowing effect of isolation layers 120 when forming the insulating structure openings can be too great. Too much plasma charge can also accumulate at isolation layers 120 that can make it harder to remove fin structures 106 and substrate 102. The shadowing effect and the plasma charging effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If height H6 is less than about 30 nm, or the ratio H2/H6 is greater than about 2, the etching process to remove portions of isolation layers 120 can take too long and the size of insulating structure 130 can be too great.

The remaining portions of fin structures 106 and substrate 102 adjacent to STI regions 104 can have a height H7 between about 8 nm and about 10 nm, between about 5 nm and about 13 nm, and between about 2 nm and about 15 nm. Height H7 can be measured from a first position to a second position. The first position can be at a bottom surface of STI regions 104. The second position can be at a point where a lateral distance (e.g., in the y-direction) between a sidewall of insulating structure 130 and the adjacent STI region 104 is about 1.5 nm. The ratio H7/(H1+H2+H3) can be between about 0.04 and about 0.06, between about 0.03 and about 0.07, and between about 0.02 and about 0.08. If height H7 is greater than about 15 nm, or the ratio H7/(H1+H2+H3) is greater than about 0.08, the leakage current can be too great, which can decrease device reliability and performance. The leakage current can be too great if the leakage current density is greater than about $10^{-11}$ A/nm. If height H7 is less than about 2 nm, or the ratio H7/(H1+H2+H3) is less than about 0.02, the etching process to remove portions of fin structures 106 and substrate 102 adjacent to STI regions 104 can take too long and the size of insulating structure 130 can be too great.

Insulating structure 130 can have a width W5 adjacent to isolation layers 120 between about 18 nm and about 22 nm. Insulating structure 130 can have a width W6 adjacent to STI regions 104 between about 10 nm and about 16 nm. The ratio W5/W6 can be between about 1.8 and about 2, between about 1.5 and about 2.1, and between about 1.125 and about 2.2. If the ratio W5/W6 is greater than about 2.2, the shadowing effect of STI regions 104 when forming the insulating structure openings can be too great. The shadowing effect can result in large amounts fin structures 106 and substrate 102 adjacent to STI regions 104 remaining. The large amounts of remaining fin structures 106 and substrate 102 adjacent to STI regions 104 can increase leakage current, which can decrease device reliability and performance. If the ratio W5/W6 is less than about 1.125, the etching process to remove portions of fin structures 106 and substrate 102 adjacent to STI regions 104 can take too long and the size of insulating structure 130 can be too great. A bottom surface of insulating structure 130 can be lower than a bottom surface of STI regions 104.

STI regions 104 can have a width W7 at the top portions of STI regions 104 between about 6 nm and about 8 nm. STI regions 104 can have a width W8 at the bottom portions of STI regions 104 between about 8 nm and about 10 nm. The ratio W7/W8 can be between about 0.75 and about 0.85, between about 0.7 and about 0.9, and between about 0.6 and about 0.95. If the ratio W7/W8 is greater than about 0.95, the shadowing effect of STI regions 104 when forming the insulating structure openings can be too great. The shadowing effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If the ratio W7/W8 is less than about 0.6, the etching process to remove the shoulders of STI regions 104 can take too long and the size of insulating structure 130 can be too great.

Top portions of STI regions 104 can have slanted sidewalls 105. An angle 2 between slanted sidewall 105 and a horizontal direction, such as the y-direction, can be between about 40° and about 45°, between about 35° and about 50°, and between about 30° and about °. If angle 2 is greater than about 55°, the shadowing effect of STI regions 104 when forming the insulating structure openings can be too great. The shadowing effect can result in large amounts of fin structures 106 and substrate 102 adjacent to STI regions 104 remaining. The large amounts of remaining fin structures 106 and substrate 102 adjacent to STI regions 104 can increase leakage current, which can decrease device reliability and performance. If angle 2 is less than about 30°, the etching process to remove the shoulders of STI regions 104 can take too long and the size of insulating structure 130 can be too great.

Figure 6:
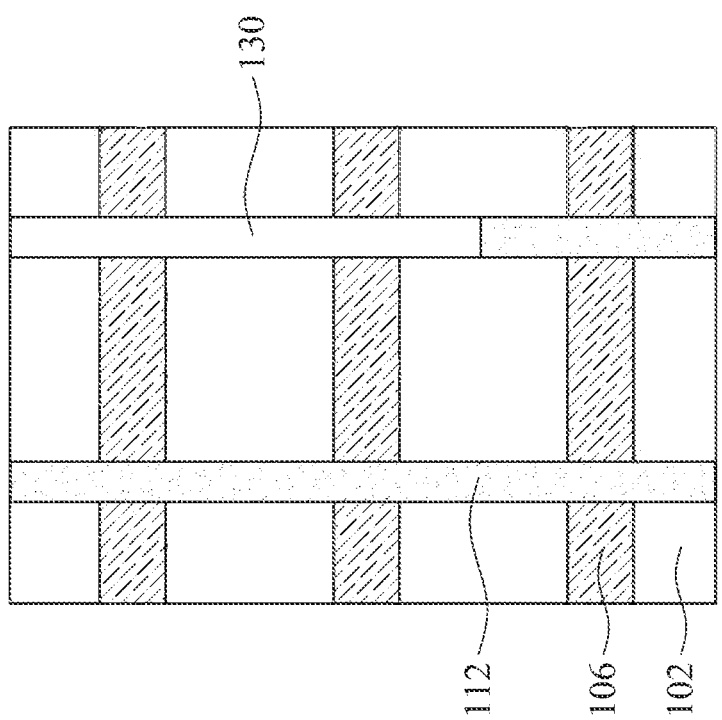
FIG. 6 illustrates a top view of a semiconductor device with an insulating structure, in accordance with some embodiments.

FIG. 6 illustrates a top view of semiconductor devices 100 and 400 with an insulating structure, according to some embodiments. In some devices, insulating structure 130 can be formed through portions of gate structures 112. Insulating structure 130 can sectionalize gate structures 112, which can allow a higher density of transistors to be formed on substrate 102. STI regions 104 (not shown in FIG. 6) can be formed between adjacent fin structures 106. Isolation layers 120 (not shown in FIG. 6) can be formed on STI regions 104. High-k dielectric layers 126 (not shown in FIG. 6) can be formed on isolation layers 120. STI regions 104, isolation layers 120, and high-k dielectric layers 126 can form isolation structures. The isolation structures can sectionalize fin structures 106 and prevent adjacent S/D regions 110 (not shown in FIG. 6) from merging together, which can further allow a higher density of transistors to be formed on substrate 102.

Figure 7:
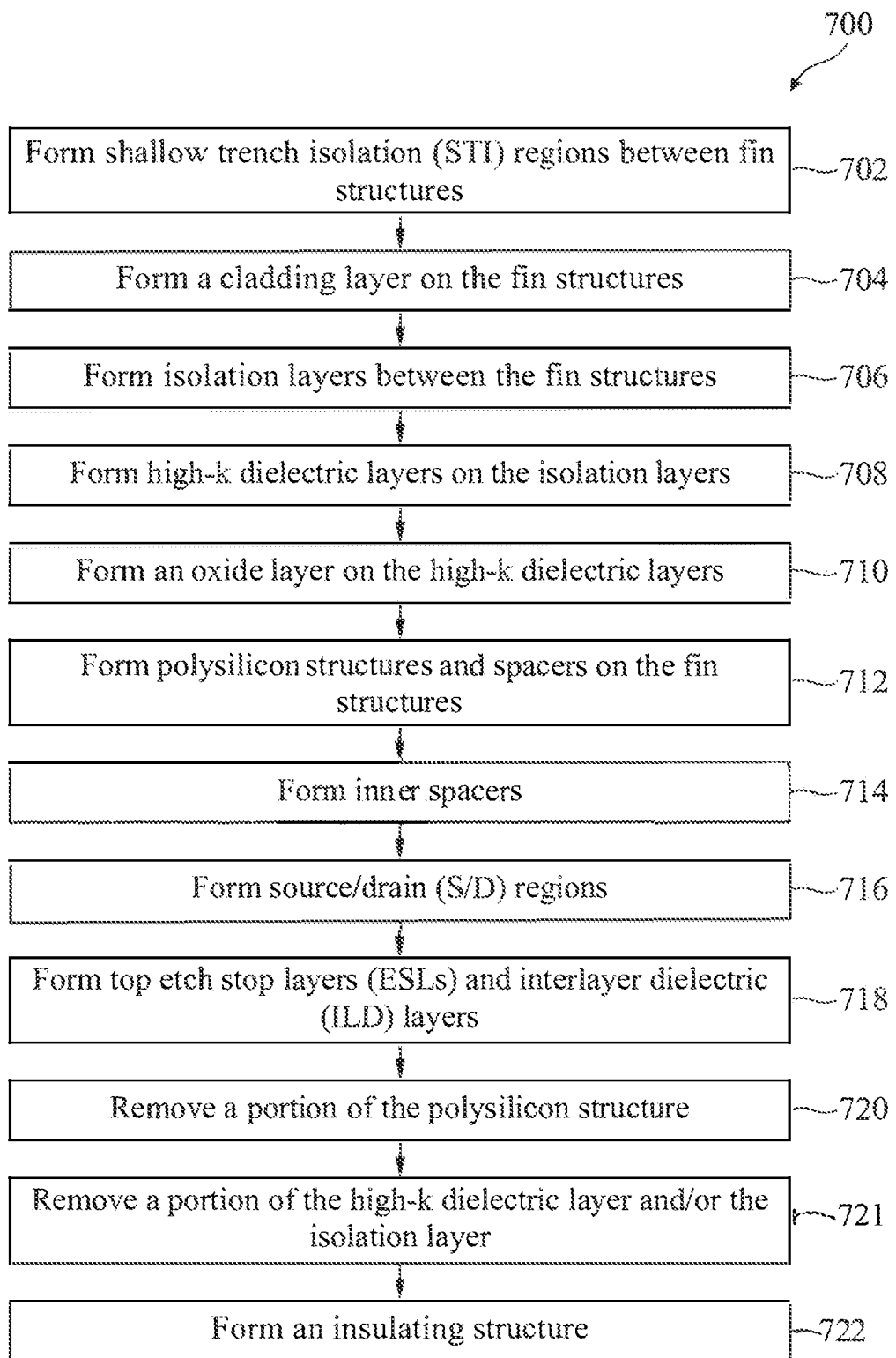
FIG. 7 is a flow diagram of a method for fabricating a semiconductor device with an insulating structure, in accordance with some embodiments.

FIG. 7 is a flow diagram of a method 700 for fabricating semiconductor devices 100 and 400 with an insulating structure as shown in FIGS. 1 and 4, according to some embodiments. For illustrative purposes, the operations illustrated in FIG. 7 will be described with reference to the example fabrication process for fabricating semiconductor devices 100 and 400 as illustrated in FIGS. 8-17, 18A, 18B, 19A, and 19B. FIGS. 8-17, 18A, 18B, 19A, and 19B are isometric views of semiconductor devices 100 and 400 at various stages of fabrication, according to some embodiments. Additional fabrication operations can be performed between the various operations of method 700 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 7. Elements in FIGS. 8-17, 18A, 18B, 19A, and 19B with the same annotations as the elements in FIGS. 1-6 are described above. It should be noted that method 700 may not produce complete semiconductor devices 100 and 400. Accordingly, it is understood that additional processes can be provided before, during, and after method 700, and that some other processes may only be briefly described herein.

Figure 8:
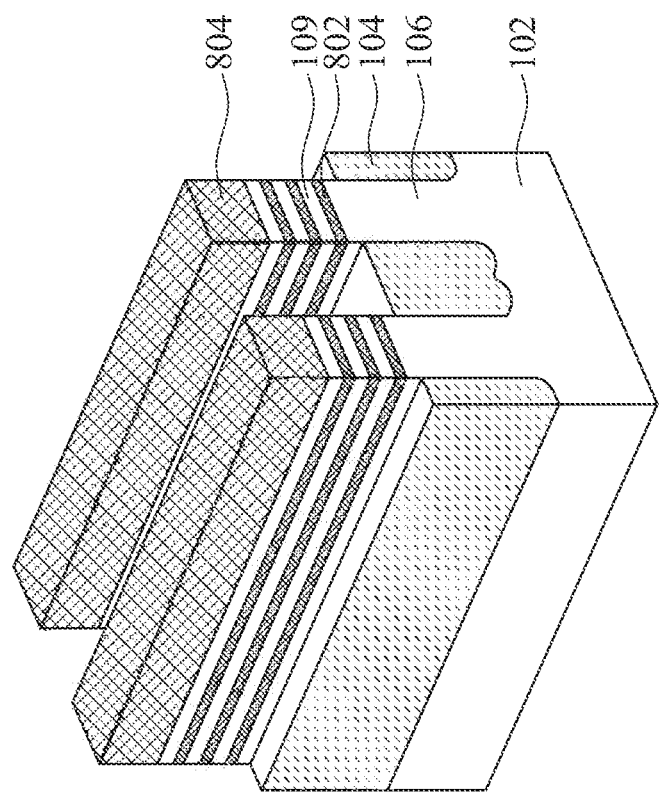
FIGS. 8-17, 18A, 18B, 19A, and 19B illustrate isometric views of semiconductor devices with an insulating structure at various stages of their fabrication process, in accordance with some embodiments.

Referring to FIG. 7, in operation 702, STI regions are formed between fin structures. For example, as shown in FIG. 8, STI regions 104 can be formed between fin structures 106. A superlattice structure can be formed on substrate 102. The superlattice structure can include fin structures 106, multiple nanostructured SiGe layers 802 epitaxially grown on fin structures 106, multiple nanostructured channel layers 109 epitaxially grown on multiple nanostructured SiGe layers 802, and a top SiGe layer 804 epitaxially grown on the top nanostructured channel layer 109. The superlattice structure can be patterned by a photolithography patterning process or a double patterning process.

A STI layer can be blanket deposited on fin structures 106, nanostructured SiGe layers 802, nanostructured channel layers 109, and top SiGe layers 804 using a chemical vapor deposition (CVD) process, a physical vapor deposition (PVD) process, or a plasma-enhanced chemical vapor deposition (PECVD) process. In some embodiments, a post-deposition anneal process can be performed. In some embodiments, a chemical mechanical planarization (CMP) process can follow the deposition of the STI layer. Portions of the STI layer can be removed and recessed by a dry etch process (e.g., reactive ion etch process) or a wet etch process to form STI regions 104. In some embodiments, a STI liner (not shown in FIG. 8) can be blanket deposited on fin structures 106, nanostructured SiGe layers 802, nanostructured channel layers 109, and top SiGe layers 804 by a CVD process or a PVD process before the STI layer is deposited.

Figure 9:
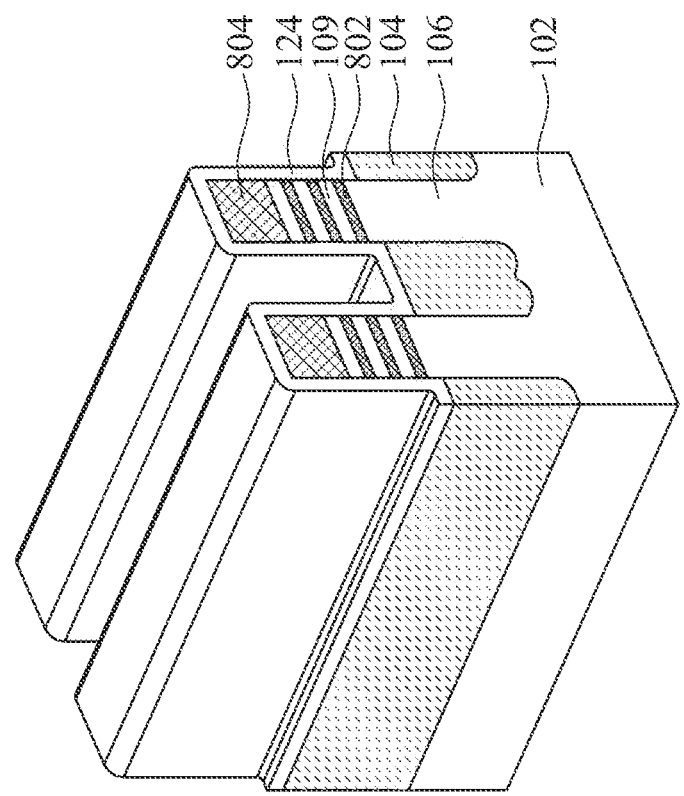

Referring to FIG. 7, in operation 704, a cladding layer is formed on the fin structures. For example, as shown in FIG. 9, cladding layer 124 can be formed on fin structures 106. Cladding layer 124 can be deposited on STI regions 104, fin structures 106, nanostructured SiGe layers 802, nanostructured channel layers 109, and top SiGe layers 804 using a CVD process with germane ($GeH_4$) and disilane ($Si_2H_6$) as precursors.

Figure 10:
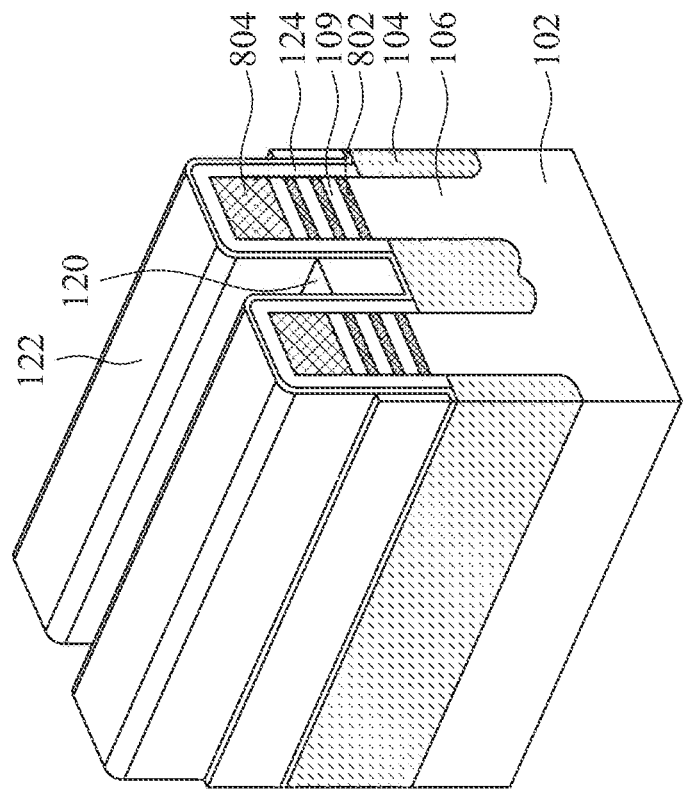

Referring to FIG. 7, in operation 706, isolation layers are formed between the fin structures. For example, as shown in FIG. 10, isolation layers 120 can be formed between fin structures 106. A dry etch process can be performed to remove portions of cladding layer 124 formed on STI regions 104. Isolation layer liner 122 can be deposited on STI regions 104, cladding layers 124, and top SiGe layers 804 by a CVD process or a PVD process. Isolation layers 120 can be blanket deposited on isolation layer liner 122 by a CVD process, a PVD process, or a PECVD process, and recessed by a dry etch process or a wet etch process.

Figure 11:
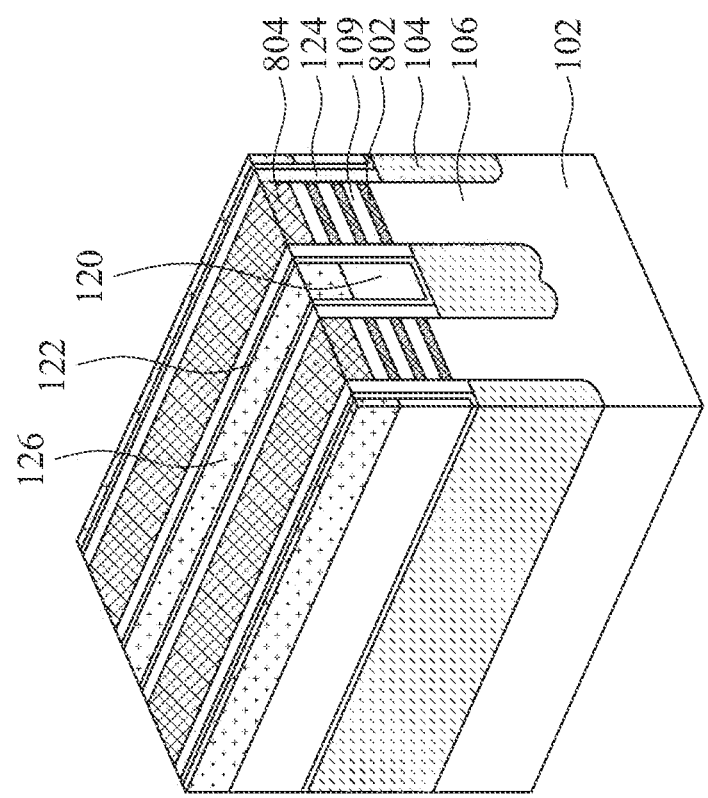

Referring to FIG. 7, in operation 708, high-k dielectric layers are formed on the isolation layers. For example, as shown in FIG. 11, high-k dielectric layers 126 can be formed on isolation layers 120. High-k dielectric layers 126 can be deposited on isolation layers 120 by a CVD process, a PVD process, or a PECVD process. A CMP process can follow the deposition of high-k dielectric layers 126 to remove portions of high-k dielectric layers 126, portions of isolation layer liner 122, portions of cladding layers 124, and portions of top SiGe layers 804.

Figure 12:
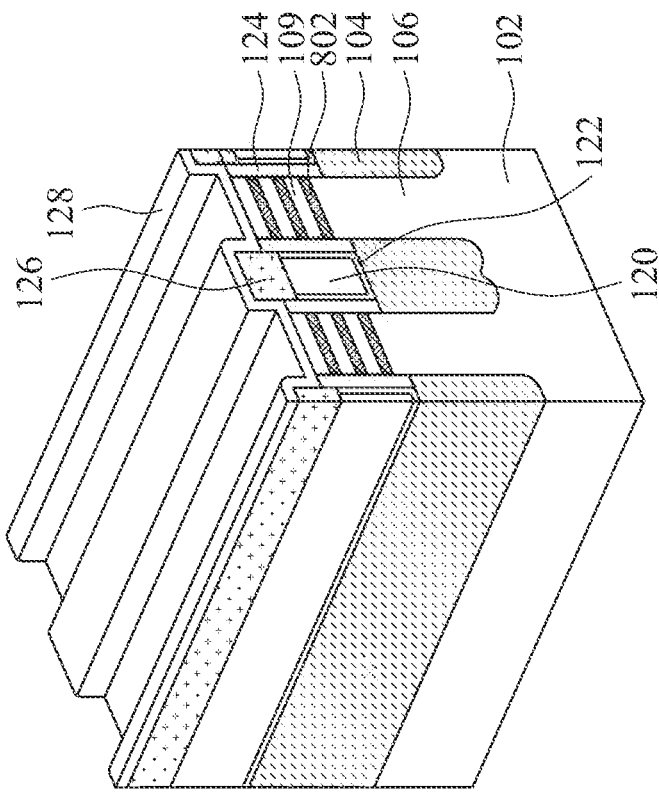

Referring to FIG. 7, in operation 710, an oxide layer is formed on the high-k dielectric layers. For example, as shown in FIG. 12, oxide layer 128 can be formed on high-k dielectric layers 126. Top SiGe layers 804 and portions of cladding layers 124 can be removed by a dry etch process or a wet etch process to expose the top nanostructured channel layers 109. Oxide layer 128 can be deposited on the top nanostructured channel layers 109, cladding layers 124, isolation layer liners 122, and high-k dielectric layers 126 by a CVD process, a PVD process, or a PECVD process.

Figure 13:
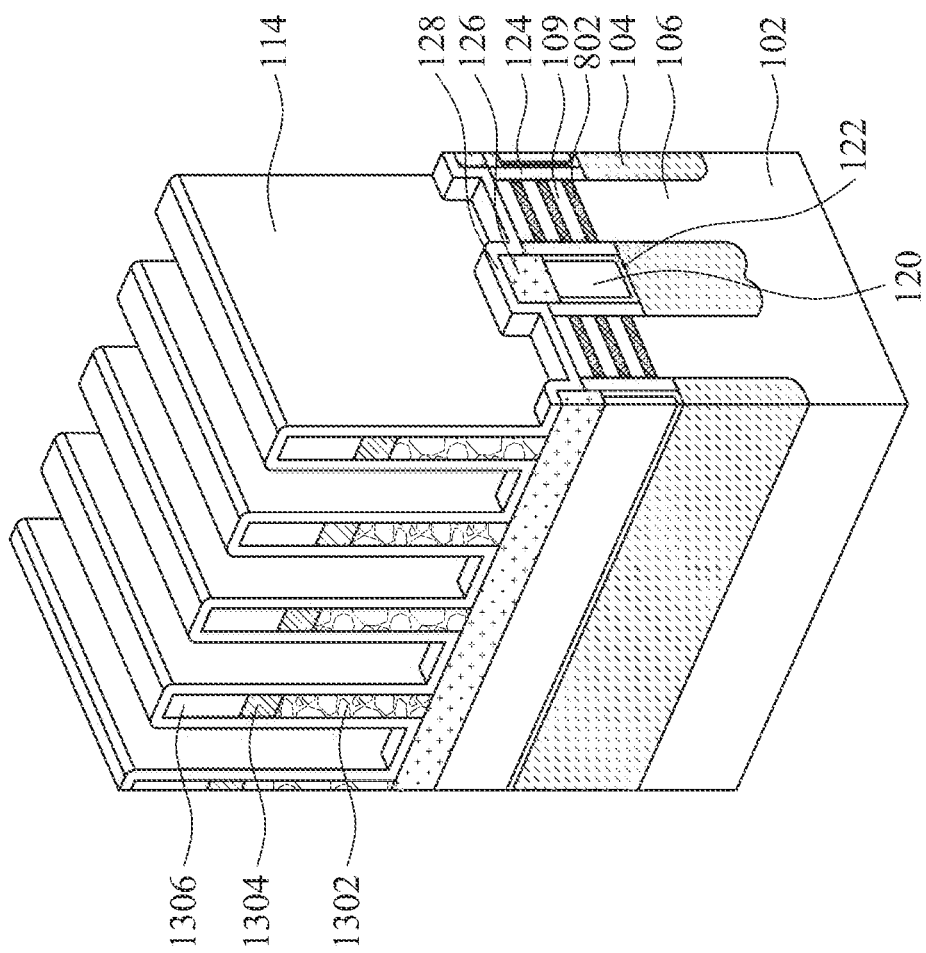

Referring to FIG. 7, in operation 712, polysilicon structures and spacers are formed on the fin structures. For example, as shown in FIG. 13, polysilicon structures 1302 and spacers 114 can be formed on fin structures 106. A layer of polysilicon material can be blanket deposited on oxide layer 128 by a CVD process or a PVD process. A nitride helmet layer 1304 can be blanket deposited on the layer of polysilicon material by a CVD process or a PVD process. An oxide helmet layer 1306 can be blanket deposited on nitride helmet layer 1304 by a CVD process or a PVD process. Oxide helmet layer 1306, nitride helmet layer 1304, and the layer of polysilicon material can be patterned by a photolithography patterning process to form polysilicon structures 1302 on fin structures 106 and oxide layer 128. In some embodiments, portions of oxide layer 128 can also be removed during the formation of polysilicon structures 1302. Spacers 114 can be formed on polysilicon structures 1302, nitride helmet layer 1304, and oxide helmet layer 1306 by a CVD process or a PVD process.

Figure 14:
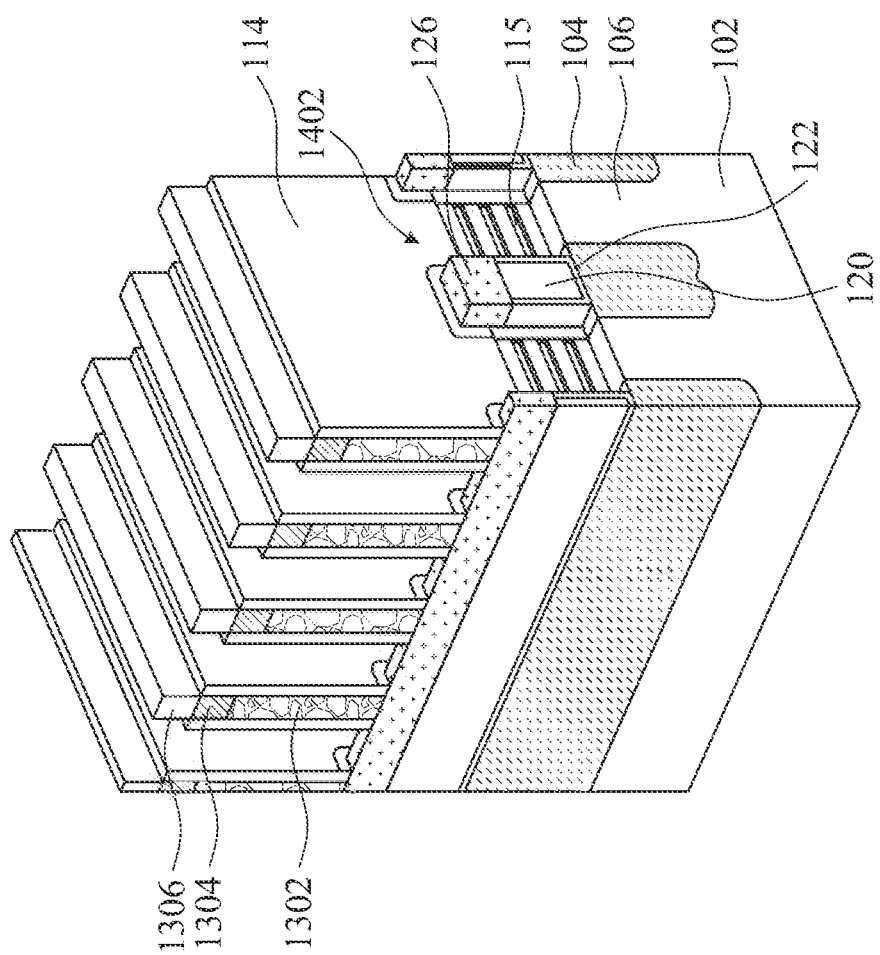

Referring to FIG. 7, in operation 714, inner spacers are formed. For example, as shown in FIG. 14, inner spacers 115 can be formed. Portions of fin structures 106 adjacent to polysilicon structures 1302 can be removed by a dry etch process or a wet etch process to form S/D openings 1402. In some embodiments, portions of spacers 114 can also be removed during the formation of S/D openings 1402. The end portions of nanostructured SiGe layers 802 (not shown in FIG. 14) and portions of cladding layers 124 (not shown in FIG. 14) can be removed by a dry etch process or a wet etch process to form inner spacer openings. A layer of insulating material can be blanket deposited in the inner spacer openings and S/D openings 1402. The layer of insulating material outside the inner spacer openings can be removed by a dry etch process or a wet etch process and inner spacers 115 can be formed.

Figure 15:
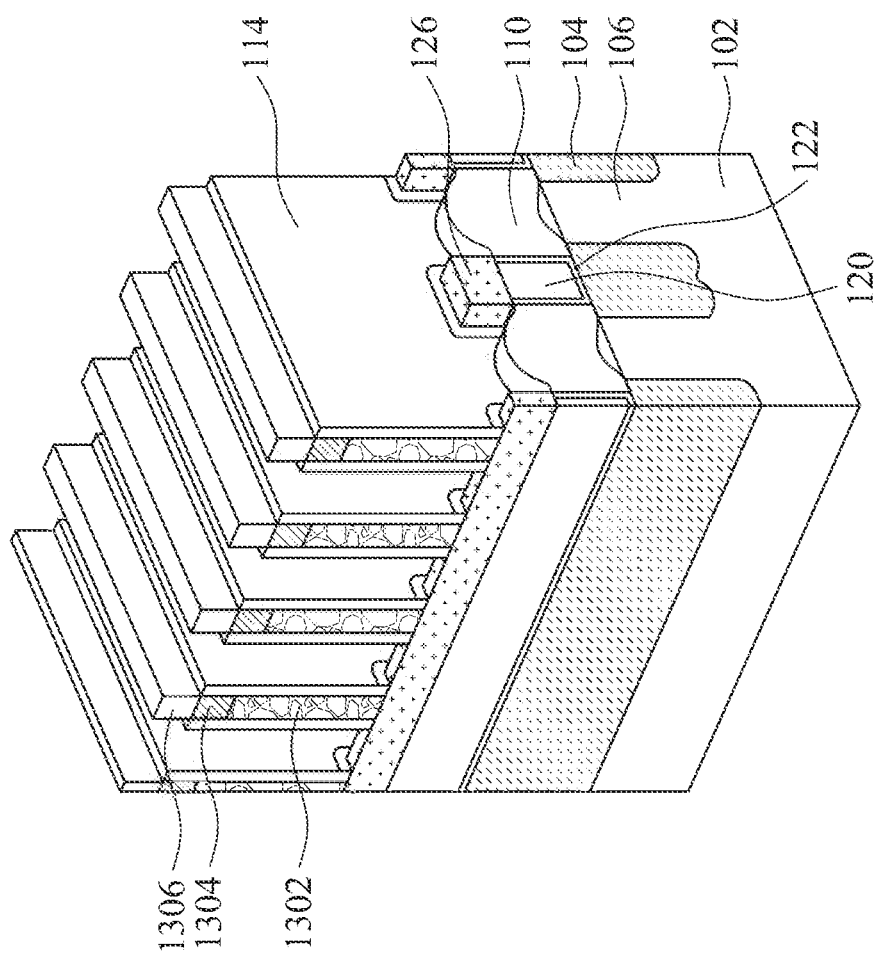

Referring to FIG. 7, in operation 716, S/D regions are formed. For example, as shown in FIG. 15, S/D regions 110 can be formed in S/D openings 1402. By way of example and not limitation, S/D regions 110 can be epitaxially grown using source gases, such as silane ($SiH_4$), silicon tetrachloride ($SiCl_4$), trichlorosilane (TCS), and dichlorosilane ($SiH_2Cl_2$ and DSC). Hydrogen ($H_2$) can be used as a reactant gas to reduce the aforementioned source gases. For example, $H_2$ can combine with Cl to form hydrogen chloride (HCl), leaving Si to epitaxially grow in S/D regions 110. The growth temperature during the epitaxial growth can range from about 700° C. to about 1250° C. depending on the gases used. In some embodiments, fin structures 106 can act as a seed layer for S/D regions 110. S/D regions 110 can be in-situ doped during their epitaxial growth process using p-type dopants, such as B, In, and Ga, or n-type dopants, such as P and As. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and other n-type doping precursor can be used.

Figure 16:
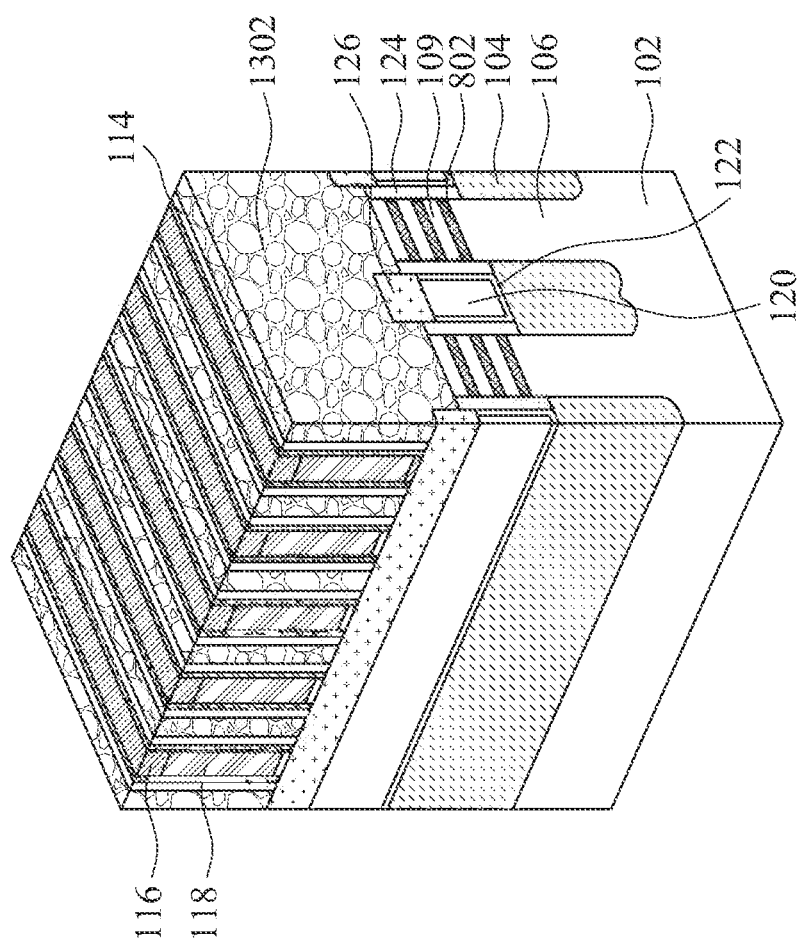

Referring to FIG. 7, in operation 718, ESLs and ILD layers are formed. For example, as shown in FIG. 16, top ESLs 116 and ILD layers 118 can be formed. ILD layers 118 can be blanket deposited on spacers 114 and S/D regions 110 by a CVD process, a PVD process, or a PECVD process. Top ESLs 116 can be blanket deposited on ILD layers 118 by a CVD process, a PVD process, or a PECVD process. A CMP process can follow the deposition of top ESLs 116 and ILD layers 118 to remove nitride helmet layer 1304 and oxide helmet layer 1306, and planarize top ESLs 116 and polysilicon structures 1302.

Figure 17:
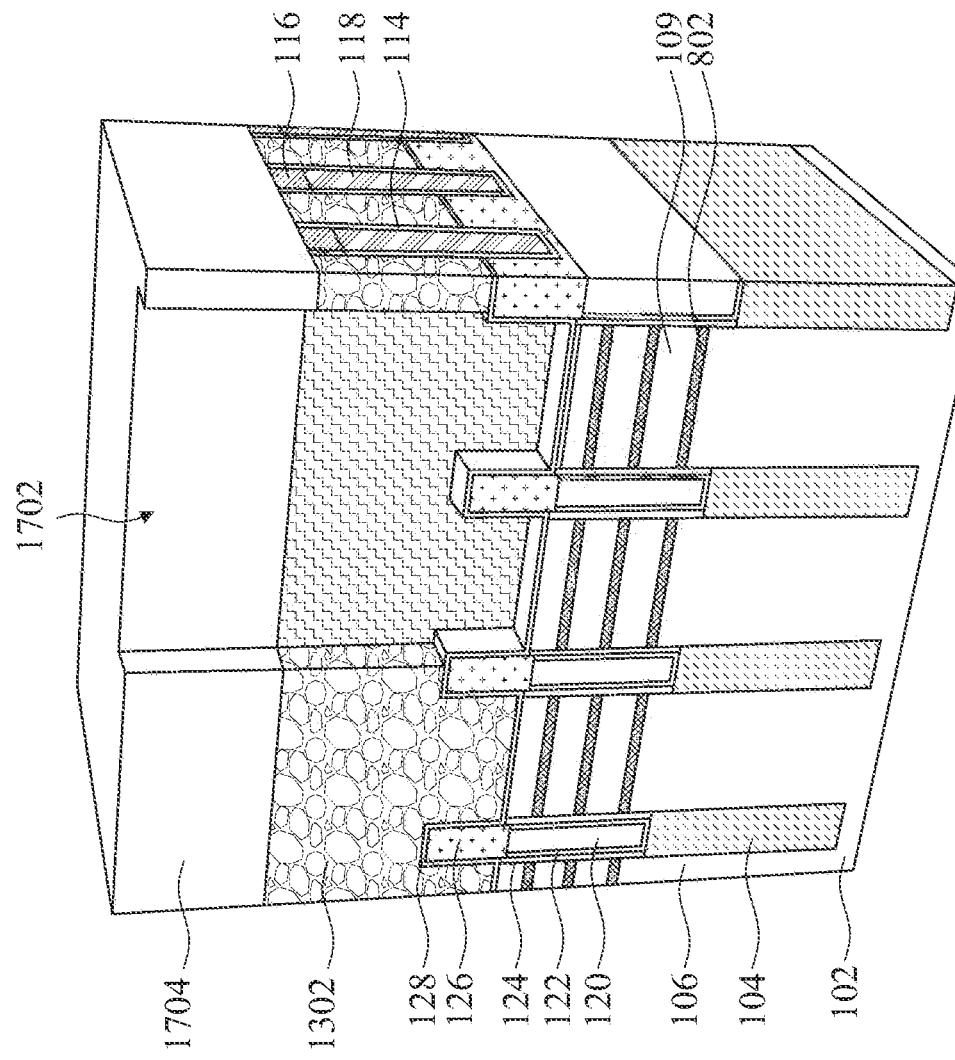

Referring to FIG. 7, in operation 720, a portion of the polysilicon structure is removed. For example, as shown in FIG. 17, a portion of polysilicon structure 1302 can be removed. In some embodiments, a SiN helmet layer 1704 can be formed on polysilicon structures 1302 and top ESLs 116. A portion of SiN helmet layer 1704 and polysilicon structure 1302 can be removed by a dry etch process or a wet etch process to form upper insulating structure opening 1702. In some embodiments, the dry etch process can include etchants with an (i) oxygen-containing gas; (ii) methane ($CH_4$); (iii) a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); (iv) a chlorine-containing gas (e.g., chlorine ($Cl_2$), chloroform ($CHCl_3$), carbon tetrachloride ($CCl_4$), and/or boron trichloride ($BCl_3$)); (v) a bromine-containing gas (e.g., hydrogen bromide (HBr) and/or bromoform ($CHBr_3$)); (vi) an iodine-containing gas; (vii) other suitable etching gases and/or plasmas; or (viii) combinations thereof. In some embodiments, the wet etch process can include etching in diluted hydrofluoric acid (DHF), potassium hydroxide (KOH) solution, hydrogen peroxide ($H_2O_2$), ammonia ($NH_3$), a solution containing hydrofluoric acid (HF), nitric acid ($HNO_3$), acetic acid ($CH_3COOH$), or combinations thereof. The etch process to form upper insulating structure opening 1702 can be a timed etch. In some embodiments, the area to form upper insulating structure opening 1702 can be defined by a photoresist layer (not shown in FIG. 17), a spin-on oxide polymer layer (not shown in FIG. 17), and a spin-on carbon polymer layer (not shown in FIG. 17).

Figure 18A:
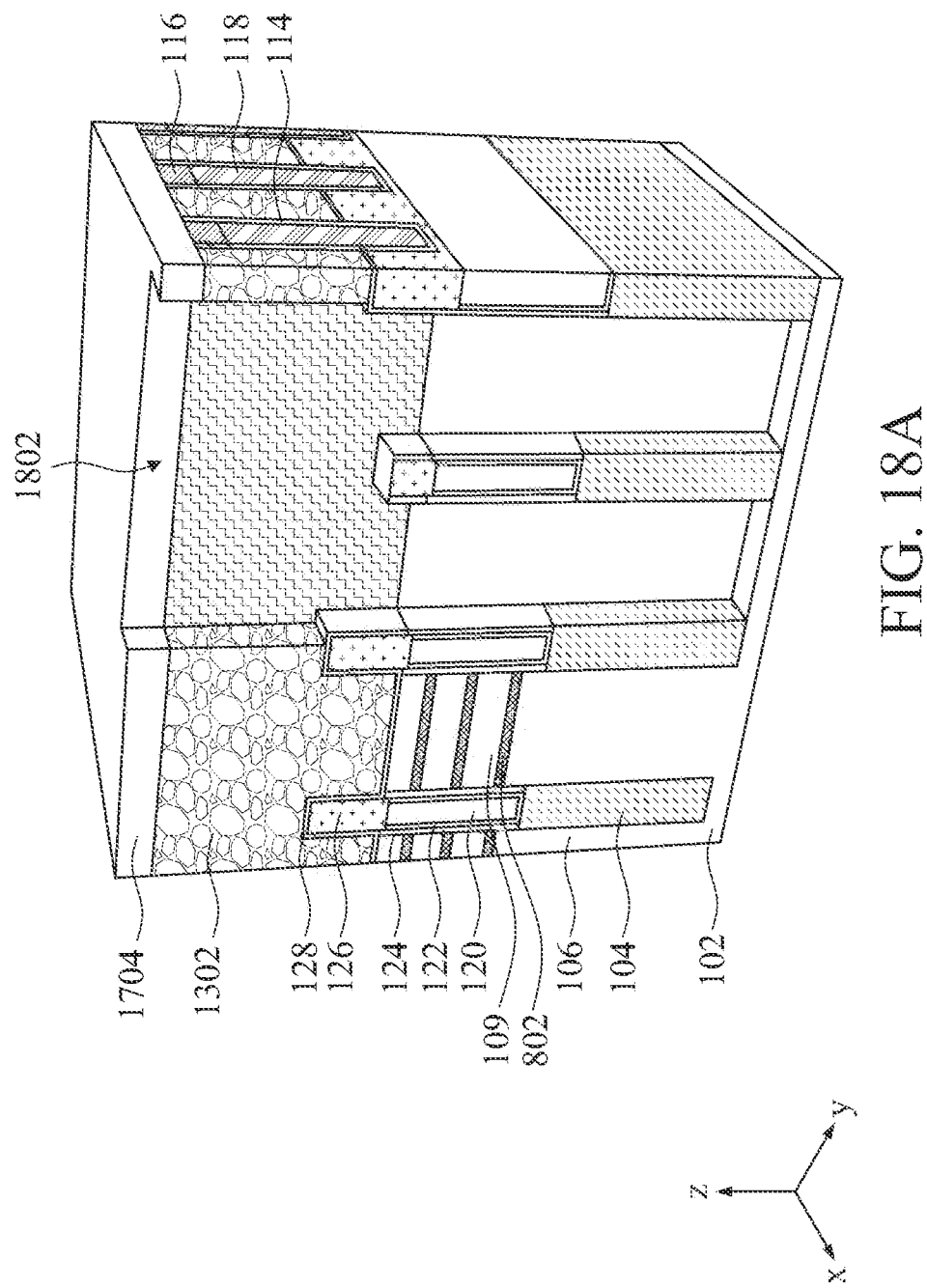
Figure 18B:
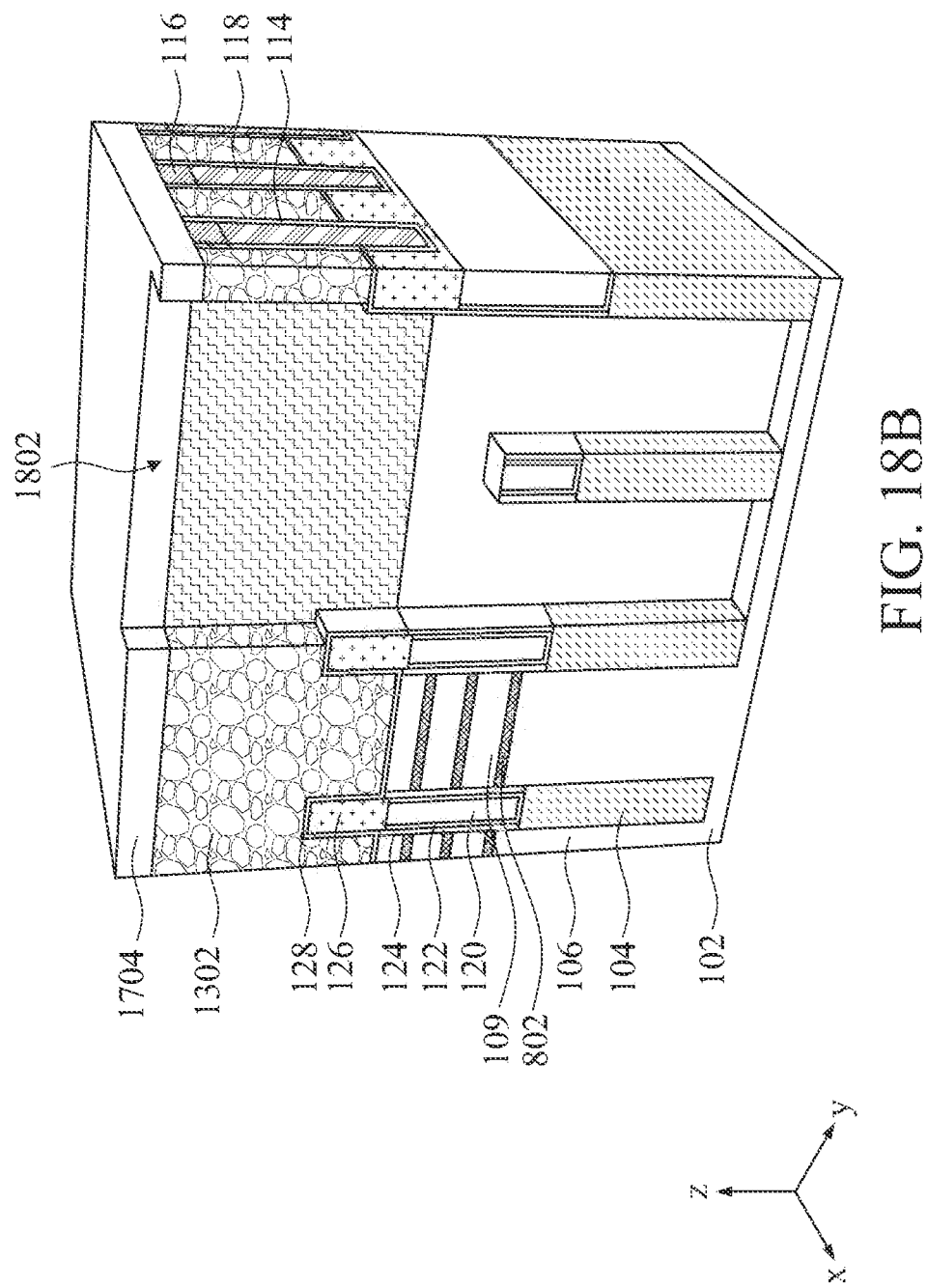

Referring to FIG. 7, in operation 721, a portion of the high-k dielectric layer and/or a portion of the isolation layer are removed. For example, as shown in FIG. 18A, a portion of high-k dielectric layer 126 can be removed. As shown in FIG. 18B, high-k dielectric layer 126 and a portion of isolation layer 120 can be removed. FIG. 18A is the isometric view of semiconductor device 100 as shown in FIG. 1 at operation 721 in the fabrication process. FIG. 18B is the isometric view of semiconductor device 400 as shown in FIG. 4 at operation 721 in the fabrication process. Portions of oxide layer 128, a portion of high-k dielectric layer 126, a portion of isolation layer 120, portions of STI regions 104, portions of isolation layer liners 122, portions of cladding layers 124, portions of nanostructured channel layers 109, portions of nanostructured SiGe layers 802, and portions of substrate 102 can be removed by a dry etch process to form insulating structure opening 1802. The etch process to form insulating structure opening 1802 can be a timed etch.

Portions of oxide layer 128 can be removed by a dry etch process using $CF_4$ as an etchant and argon (Ar) as a carrier gas. The flow rate of $CF_4$ can be between about 50 sccm and about 100 sccm, between about 10 sccm and about 150 sccm, and between about 1 sccm and about 200 sccm. If the flow rate of $CF_4$ is less than about 1 sccm, the dry etch process cannot break through oxide layer 128. If the flow rate of $CF_4$ is greater than about 200 sccm, the dry etch process can over etch laterally (e.g., in the y-direction). The directional etch desired in the z-direction can be reduced. The flow rate of Ar can be between about 100 sccm and about 1000 sccm.

A portion of high-k dielectric layer 126, a portion of isolation layer 120, portions of STI regions 104, portions of isolation layer liners 122, portions of cladding layers 124, portions of nanostructured channel layers 109, portions of nanostructured SiGe layers 802, and portions of substrate 102 can be removed by a dry etch process using HBr and oxygen ($O_2$) as etchants and Ar as a carrier gas. The gas mixture of HBr and $O_2$ has low selectivity towards different materials but high directionality in the z-direction. Therefore, the gas mixture of HBr and $O_2$ can reduce the shadowing effect of high-k dielectric layer 126, isolation layer 120, and STI region 104 without over etching laterally (e.g., in the y-direction).

The flow rate of HBr can be between about 300 sccm and about 600 sccm, between about 200 sccm and about 800 sccm, and between about 100 sccm and about 1000 sccm. The flow rate of $O_2$ can be between about 10 sccm and about 60 sccm, between about 5 sccm and about 80 sccm, and between about 1 sccm and about 100 sccm. If the flow rate of HBr is less than about 100 sccm, or the flow rate of $O_2$ is less than about 1 sccm, the dry etch speed can be too low. If the flow rate of HBr is greater than about 1000 sccm, or the flow rate of $O_2$ is greater than about 100 sccm, the dry etch speed can be too high and the control of the dry etch process can be too difficult. The flow rate of Ar can be between about 100 sccm and about 1000 sccm.

Figure 19A:
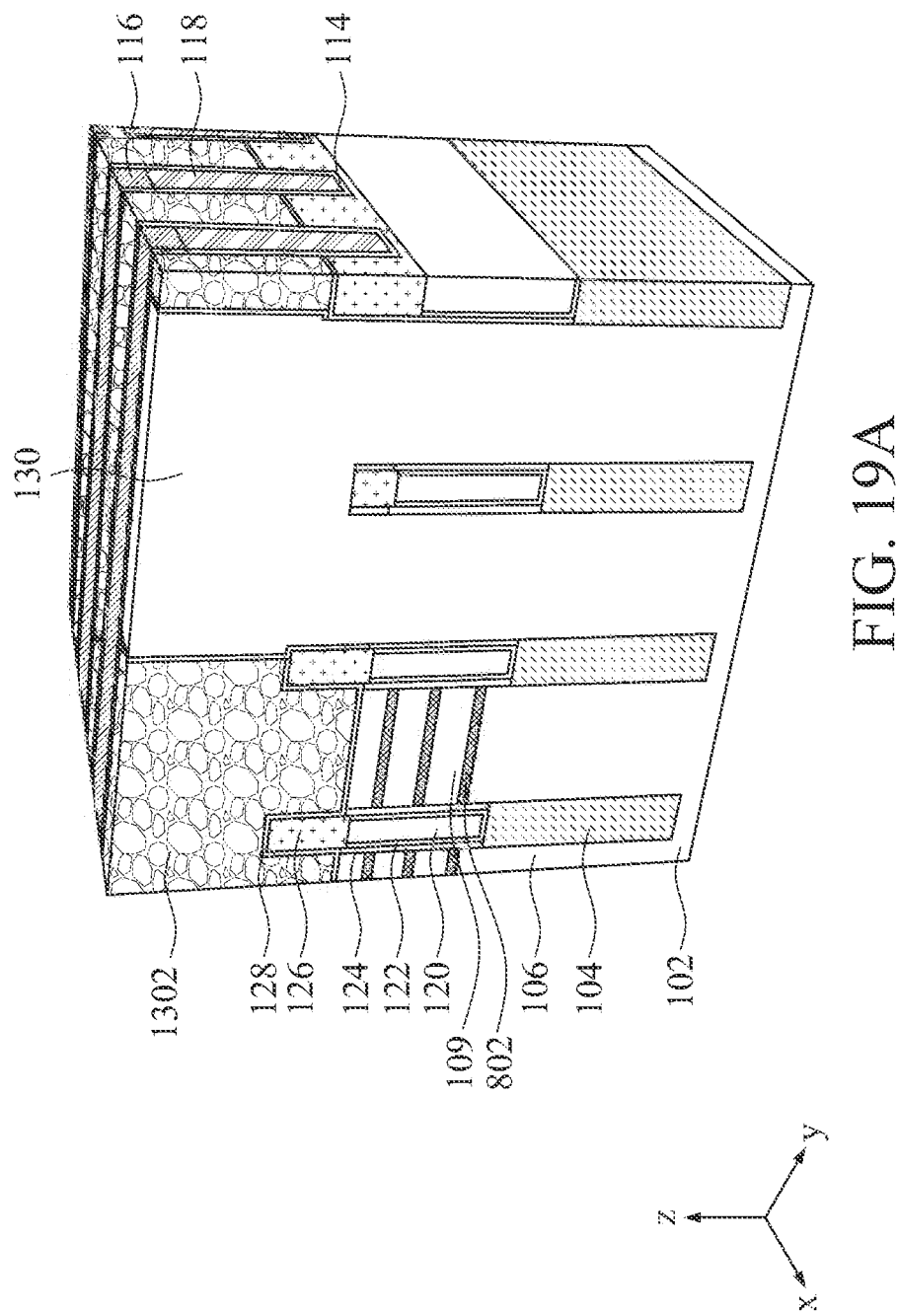
Figure 19B:
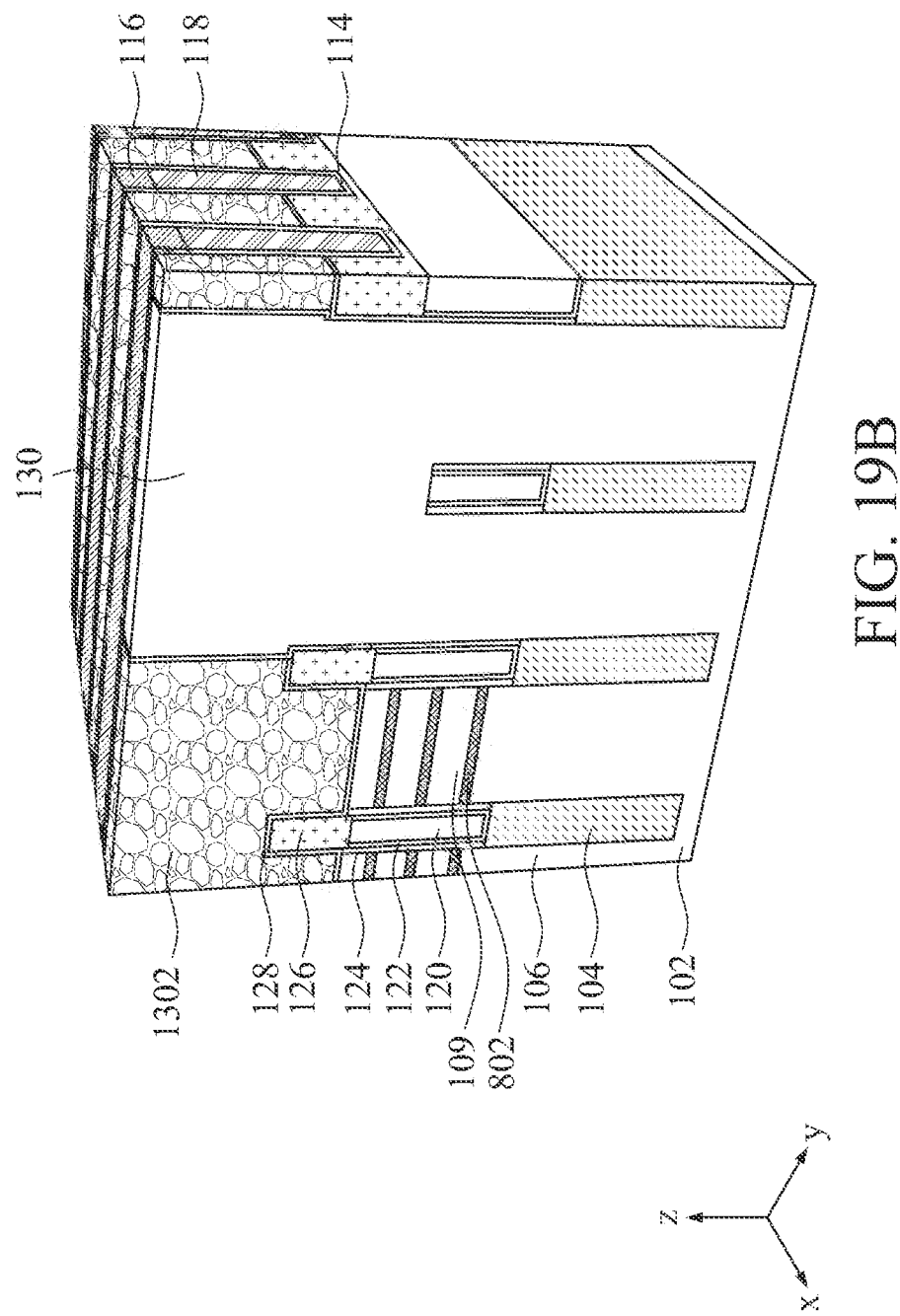

Referring to FIG. 7, in operation 722, an insulating structure is formed. For example, as shown in FIGS. 19A and 19B, insulating structure 130 is formed. FIG. 19A is the isometric view of semiconductor device 100 as shown in FIG. 1 at operation 722 in the fabrication process. FIG. 19B is the isometric view of semiconductor device 400 as shown in FIG. 4 at operation 722 in the fabrication process. Insulating structure 130 can be formed in insulating structure opening 1802 by an atomic layer deposition (ALD) process. The ALD process can result in a conformal formation of insulating structure 130 in small areas and openings, which can reduce defects. A CMP process can follow the deposition of insulating structure 130 to remove SiN helmet layer 1704 and planarize insulating structure 130 and polysilicon structures 1302.

In some embodiments, polysilicon structures 1302 can be replaced with gate structures 112 and nanostructured SiGe layers 802 can be replaced with nanostructured gate layers 108. Polysilicon structures 1302 and nanostructured SiGe layers 802 can be removed by a dry etch process to form gate structure openings and gate layer openings. Gate dielectric layers can be deposited in gate structure openings and gate layer openings by a PECVD process, a CVD process, a PVD process, or an ALD process. WFM layers can be deposited on gate dielectric layers by a PECVD process, a CVD process, a PVD process, an ALD process, or a metal organic chemical vapor deposition (MOCVD) process. Metal fill layers can be deposited on WFM layers by a PECVD process, a CVD process, a PVD process, an ALD process, a MOCVD process, or a sputtering process. After polysilicon structures 1302 are replaced with gate structures 112 and nanostructured SiGe layers 802 are replaced with nanostructured gate layers 108, semiconductor devices 100 and 400 as shown in FIGS. 1 and 4 can be formed.

The present disclosure provides example semiconductor devices (e.g., semiconductor devices 100 and 400) with an insulating structure (e.g., insulating structure 130) and an example method (e.g., method 700) for fabricating the same. In some embodiments, when forming the insulating structure openings (e.g., insulating structure opening 1802), portions of the high-k dielectric layers (e.g., high-k dielectric layers 126) can be removed by an etch process. Portions of the STI regions (e.g., STI regions 104) can also be removed to form slanted sidewalls (e.g., slanted sidewalls 105) at the top portions of the STI regions. The reduced height of the high-k dielectric layers and the slanted sidewalls at the top portions of the STI regions can reduce the shadowing effect of the high-k dielectric layers and the STI regions and the plasma charging effect at the high-k dielectric layers. Therefore, an increased amount of fin structures (e.g., fin structures 106) and substrate (e.g., substrate 102) adjacent to the STI regions can be removed after the insulating structure openings are formed. The insulating structures can be formed in the insulating structure openings. Less fin structures and less substrate can be interposed between the insulating structures and the STI regions. Because more of the fin structures and substrate are removed, leakage current can be reduced, which can improve device reliability and performance. In some embodiments, the leakage current can be reduced by an order between about $10^2$ and about $10^4$.

In some embodiments, when forming the insulating structure openings, the high-k dielectric layers can be removed by an etch process. Portions of the isolation layers (e.g., isolation layers 120) can be removed. Portions of the STI regions can also be removed to form slanted sidewalls at the top portions of the STI regions. The reduced height of the isolation layers and the slanted sidewalls at the top portions of the STI regions can reduce the shadowing effect of the isolation layers and the STI regions and the plasma charging effect at the isolation layers. Therefore, an increased amount of fin structures and substrate adjacent to the STI regions can be removed after the insulating structure openings are formed. The insulating structures can be formed in the insulating structure openings. Because more of the fin structures and substrate are removed, leakage current can be reduced, which can improve device reliability and performance. In some embodiments, the leakage current can be reduced by an order between about $10^2$ and about $10^4$.

In some embodiments, a structure includes a first isolation structure including a first isolation layer disposed on a substrate, a second isolation layer disposed on the first isolation layer, and a first high-k dielectric layer having a first height and disposed on the second isolation layer. The structure further includes a second isolation structure including a third isolation layer disposed on the substrate, a fourth isolation layer disposed on the third isolation layer, and a second high-k dielectric layer having a second height and disposed on the fourth isolation layer, where the second height is less than the first height. The structure further includes a gate structure disposed on the first isolation structure, and an insulating structure disposed adjacent to the gate structure and on the second isolation structure.

In some embodiments, a structure includes a fin structure disposed on a substrate, and a first isolation structure adjacent to the fin structure and including a first isolation layer disposed on the substrate, a second isolation layer disposed on the first isolation layer, and a high-k dielectric layer disposed on the second isolation layer. The structure further includes a gate structure disposed on the fin structure and in contact with the high-k dielectric layer. The structure further includes a second isolation structure including a third isolation layer disposed on the substrate and a fourth isolation layer disposed on the third isolation layer, and an insulating structure disposed adjacent to the gate structure and in contact with the fourth isolation layer.

In some embodiments, a method includes forming a first isolation structure including a first isolation layer on a substrate, a second isolation layer on the first isolation layer, and a first high-k dielectric layer on the second isolation layer. The method further includes forming a second isolation structure including a third isolation layer on the substrate, a fourth isolation layer on the third isolation layer, and a second high-k dielectric layer on the fourth isolation layer. The method further includes forming a polysilicon structure on the first and second isolation structures and forming an opening by removing a portion of the polysilicon structure, a portion of the third isolation layer, and a portion of the second high-k dielectric layer such that a height of the first high-k dielectric layer is greater than a height of the second high-k dielectric layer. The method further includes forming an insulating structure in the opening.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
  a first isolation structure comprising a first isolation layer disposed on a substrate, a second isolation layer disposed above the first isolation layer, and a first high-k dielectric layer having a first height and disposed on the second isolation layer;
  a second isolation structure comprising a third isolation layer disposed on the substrate, a fourth isolation layer disposed above the third isolation layer, and a second high-k dielectric layer having a second height and disposed on the fourth isolation layer, wherein the second height is less than the first height;
  a gate structure disposed on the first isolation structure; and
  an insulating structure disposed adjacent to the gate structure and on the second isolation structure.

2. The structure of claim 1, wherein the first and third isolation layers comprise an oxide liner, and wherein the second and fourth isolation layers comprise a silicon carbon nitride (SiCN) liner.

3. The structure of claim 1, wherein the first and second high-k dielectric layers comprise hafnium5 oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), lanthanum oxide ($La_2O_3$), zirconium silicate ($ZrSiO_2$), and combinations thereof.

4. The structure of claim 1, wherein a ratio between the first height of the first high-k dielectric layer and the second height of the second high-k dielectric layer is between about 1.5 and about 5.

5. The structure of claim 1, wherein a top portion of the third isolation layer comprises a slanted sidewall, and wherein an angle between the slanted sidewall and a horizontal direction is between about 60° and about 85°.

6. The structure of claim 1, wherein a portion of the substrate is interposed between the third isolation layer and the insulating structure, and wherein a height of the portion of the substrate measured from a bottom surface of the third isolation layer is between about 5 nm and about 20 nm.

7. The structure of claim 6, wherein a ratio between the height of the portion of the substrate and a height of the second isolation structure is between about 0.025 and about 0.1.

8. The structure of claim 1, wherein a bottom surface of the insulating structure is below a bottom surface of the third isolation layer.

9. The structure of claim 1, wherein a top surface of the insulating structure and a top surface of the gate structure are substantially coplanar.

10. The structure of claim 1, further comprising:
a fin structure disposed adjacent to the first isolation structure and on the substrate;
a nanostructured gate layer disposed on the fin structure;
a nanostructured channel layer disposed on the nanostructured gate layer; and
a source/drain (S/D) region disposed on a first portion of the fin structure, wherein the gate structure is disposed on a second portion of the fin structure.

11. A structure, comprising:
a fin structure disposed on a substrate;
a first isolation structure adjacent to the fin structure and comprising a first isolation layer disposed on the substrate, a second isolation layer disposed above the first isolation layer, and a high-k dielectric layer disposed on the second isolation layer;
a gate structure disposed on the fin structure and in contact with the high-k dielectric layer;
a second isolation structure comprising a third isolation layer disposed on the substrate and a fourth isolation layer disposed above the third isolation layer; and
an insulating structure disposed adjacent to the gate structure and in contact with the fourth isolation layer.

12. The structure of claim 11, wherein a ratio between a height of the second isolation layer and a height of the fourth isolation layer is between about 1.2 and about 2.

13. The structure of claim 11, wherein a top portion of the third isolation layer comprises a slanted sidewall, and wherein an angle between the slanted sidewall and a horizontal direction is between about 30° and about 55°.

14. The structure of claim 11, wherein a portion of the substrate is interposed between the third isolation layer and the insulating structure, and wherein a height of the portion of the substrate measured from a bottom surface of the third isolation layer is between about 2 nm and about 15 nm.

15. The structure of claim 14, wherein a ratio between the height of the portion of the substrate and a height of the first isolation structure is between about 0.02 and about 0.08.

16. The structure of claim 11, wherein the insulating structure comprises a first width adjacent to the fourth isolation layer and a second width, less than the first width, adjacent to the third isolation layer.

17. A structure, comprising:
a first isolation structure comprising a first isolation layer disposed on a substrate, a second isolation layer disposed above the first isolation layer, and a first high-k dielectric layer having a first height and disposed on the second isolation layer;
a second isolation structure comprising a third isolation layer disposed on the substrate, a fourth isolation layer disposed above the third isolation layer, and a second high-k dielectric layer having a second height and disposed on the fourth isolation layer, wherein the second height is lower than the first height in a lateral direction;
a gate structure disposed on the first isolation structure; and
an insulating structure disposed adjacent to the gate structure and on the second isolation structure.

18. The structure of claim 17, wherein the first and third isolation layers comprise an oxide liner, and wherein the second and fourth isolation layers comprise a silicon carbon nitride (SiCN) liner.

19. The structure of claim 17, wherein the first and second high-k dielectric layers comprise hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), lanthanum oxide ($La_2O_3$), zirconium silicate ($ZrSiO_2$), and combinations thereof.

20. The structure of claim 17, wherein a top portion of the third isolation layer comprises a slanted sidewall, and wherein an angle between the slanted sidewall and a horizontal direction is between about 60° and about 85°.

* * * * *